(12) United States Patent
Kwon et al.

(10) Patent No.: US 7,053,706 B2
(45) Date of Patent: May 30, 2006

(54) HIGH LINEARITY DOHERTY COMMUNICATION AMPLIFIER WITH BIAS CONTROL

(76) Inventors: Youngwoo Kwon, 103 Hyunjin Villa, Bundang-dong, Bundang-gu, Seongnam, Kyunggi-Do (KR); Junghyun Kim, 105-404 Samsung APT, 414, neson-dong, Uiwang City (KR)

( * ) Notice: Subject to any disclaimer, the term of this patent is extended or adjusted under 35 U.S.C. 154(b) by 105 days.

(21) Appl. No.: 10/690,923

(22) Filed: Oct. 21, 2003

(65) Prior Publication Data

US 2004/0119533 A1 Jun. 24, 2004

Related U.S. Application Data

(63) Continuation-in-part of application No. 10/432,553, filed as application No. PCT/KR02/00163 on Feb. 4, 2002.

(30) Foreign Application Priority Data

Feb. 1, 2002 (KR) ................. 2002-5924

(51) Int. Cl.
*H03F 3/68* (2006.01)
(52) U.S. Cl. .................... 330/124 R; 330/84
(58) Field of Classification Search ............ 330/124 R, 330/295, 127, 129, 134, 136, 84
See application file for complete search history.

(56) References Cited

U.S. PATENT DOCUMENTS

| | | | |
|---|---|---|---|
| 2,210,028 A | 8/1940 | Doherty | |
| 4,335,363 A | 6/1982 | Bowers | |
| 5,420,541 A * | 5/1995 | Upton et al. | ................. 330/286 |
| 5,568,086 A | 10/1996 | Schuss et al. | |
| 5,739,723 A | 4/1998 | Sigmon et al. | |
| 5,757,229 A * | 5/1998 | Mitzlaff | .................. 330/124 R |
| 5,786,727 A | 7/1998 | Sigmon | |
| 5,880,633 A * | 3/1999 | Leizerovich et al. | .......... 330/84 |
| 6,084,468 A | 7/2000 | Sigmon et al. | |
| 6,128,479 A | 10/2000 | Fitzpatrick et al. | |
| 6,262,629 B1 | 7/2001 | Stengel et al. | |
| 6,356,149 B1 | 3/2002 | Stengel et al. | |

(Continued)

OTHER PUBLICATIONS

Wallace, Laurie, "Amplifier Linearization Promotes Efficiency in Multi-Carrier WCDMA Basestation," EE Times, Oct. 18, 2002, at http://www.eetimes.com/story/OEG20021018S0059.

(Continued)

*Primary Examiner*—Henry Choe

(57) ABSTRACT

The present invention relates to bias control of a power amplification circuit of a mobile device for improving the efficiency and the linearity properties of the power amplifier. In one embodiment, the power amplifier improves these properties by receiving a voltage control signal to bias a supplemental amplifier so that the power amplifier operates in a Doherty mode in a low output power range and in a non-Doherty mode in a high output power range. In the non-Doherty mode, the supplemental amplifier is biased as a class AB amplifier via the received voltage control signal to satisfy the non-linear operational requirements of the power amplifier in the high output power range. The power amplifier generates the voltage control signal based upon power levels of signals received from a remote base station.

31 Claims, 14 Drawing Sheets

U.S. PATENT DOCUMENTS

| | | |
|---|---|---|
| 6,374,092 B1 | 4/2002 | Leizerovich et al. |
| 6,396,341 B1 | 5/2002 | Pehlke |
| 6,469,581 B1 | 10/2002 | Kobayashi |
| 6,791,417 B1 | 9/2004 | Pengelly et al. |
| 6,853,245 B1 * | 2/2005 | Kim et al. .............. 330/124 R |
| 2004/0174212 A1 | 9/2004 | Kim et al. |

OTHER PUBLICATIONS

Raab, F.H., "Efficiency of Doherty RF Power-Amplifier Systems," IEEE Transactions On Broadcasting, Sep. 1987, pp. 77-83, vol. BC-33.

Iwamoto, M., et al., "An Extended Doherty Amplifier with High Efficiency Over a Wide Power Range," IEEE Transactions On Microwave Theory and Techniques, Dec. 2001, pp. 2472-2479, vol. 49, No. 12.

Zhao, Y., et al., "Doherty Amplifier with DSP Control to Improve Performance in CDMA Operation," 2003 IEEE MTT-S Digest, 2003, pp. 687-690, IEEE.

Lees, J., et al. "Single-Tone Optimisation of an Adaptive-Bias Doherty Structure," 2003 IEEE MTT-S Digest, 2003, pp. 2213-2216, IEEE.

Bae, S., et al., "Bias-Switching Quasi-Doherty-Type Amplifier for CDMA Handset Applications," 2003 IEEE MTT-S Digest, 2003, pp. 137-140, IEEE.

* cited by examiner

HIGH LINEARITY DOHERTY COMMUNICATION AMPLIFIER WITH BIAS CONTROL

RELATED APPLICATIONS

This application is a continuation-in-part application of U.S. patent application Ser. No. 10/432,553 filed on May 21, 2003 entitled "Power Amplification Apparatus of Portable Terminal," which is National Stage application for and claims priority to International Application No. PCT/KR02/00163, filed Feb. 4, 2002, which claims priority to Korean Utility Patent Application No. 2002-5924, filed on Feb. 1, 2002, all of which are incorporated by reference herein for all purposes. The present invention is also related to U.S. patent application Ser. No. 10/737,364 entitled "High Linearity Doherty Communication Amplifier with Phase Control" filed Dec. 15, 2003, and U.S. patent application Ser. No. 10/737,476 entitled "High Linearity Doherty Communication Amplifier with Integrated Output Matching Unit" filed Dec. 15, 2003.

TECHNICAL FIELD

The present invention relates to a power amplification circuit for use in wireless communication technologies, and more particularly to a power amplifier circuit in a mobile handset.

BACKGROUND ART

As mobile handsets used for wireless communication services are becoming smaller and lighter, battery size and power is also decreasing. Consequently, the effective talk time (i.e., transmission time) of mobile computing devices, mobile phones, and the like (i.e., handsets) is reduced.

In a conventional mobile handset, the Radio Frequency (RF) power amplifier consumes most of the power consumed in contrast to the overall system of the mobile handset. Thus, the RF power amplifier having a low efficiency typically results in degradation of the efficiency for the overall system, and accordingly reduces the talk time.

For this reason, much effort has been concentrated on increasing efficiency of the RF power amplifier in the field of power amplification. In one approach, a Doherty-type power amplifier has been introduced recently as a circuit for increasing efficiency of the RF power amplifier. Unlike other conventional power amplifiers, whose efficiency is low over the low output power range, the Doherty-type power amplifier is designed to maintain an optimum efficiency over a wide output power range (e.g., in low, intermediate, and high output power ranges).

A common Doherty-type power amplifier design includes both a carrier and a peak amplifier. The carrier amplifier (i.e., power or main amplifier), which is composed of relatively small transistors, operates to maintain the optimal efficiency up to a certain low output power level. The peak amplifier (i.e., supplemental or auxiliary amplifier) operates in cooperative fashion with the carrier amplifier to maintain a high efficiency until the power amplifier, as a whole, produces a maximum output power. When the power amplifier operates within a low power output range, only the carrier amplifier is operational; the peak amplifier, being biased as a class B or C, does not operate. But, when the power amplifier operates within a high power output range, the peak amplifier is active and may introduce nonlinearity into the overall power amplifier since the peak amplifier is biased as a highly nonlinear class B or class C amplifier.

Theoretically, the above-mentioned Doherty-type power amplifier is designed to operate while meeting the linearity specification over an entire output power range and where high efficiency is maintained. However, as described above, because the Doherty-type power amplifier comprises a carrier amplifier and a peak amplifier that operate with each other, the Doherty-type power amplifier in practice does not satisfy the linearity specification (e.g., in terms of phase or gain characteristics) over the entire output power range where high efficiency is maintained.

In summary, in the above-mentioned Doherty-type power amplifier in the related art, the linearity characteristics of such a power amplification device are difficult to predict, which makes it difficult to improve such linearity characteristics because the peak amplifier is biased at a relatively constant, low DC current level, such as a current to set the peak amplifier as a class B or C amplifier.

BRIEF SUMMARY OF THE INVENTION

There is a need to overcome the drawbacks of the prior art and to provide at least the advantages described hereinafter. In order to solve the above problems pertaining to the previous technology, a specific embodiment of the present invention provides a power amplifier in a mobile handset that improves efficiency and linearity by applying a voltage control signal to a peak amplifier to bias the peak amplifier. Typically, a baseband modem chipset generates the voltage control signal according to power levels of signals received from a base station. Specifically, in a low output power range, a control voltage in a first state is applied to the peak amplifier so that the power amplifier is operated in a Doherty mode and, in the high output power range, a control voltage in a second state is applied to the peak amplifier so as to sufficiently manage the non-linearity characteristic of the power amplifier. In one embodiment of the invention, the voltage control signal in the first state is a high voltage state signal, and the voltage control signal in the second state is a low voltage state signal. In another embodiment of the invention, the voltage control signal in the first state is the low voltage state signal, and the voltage control signal in the second state is the high voltage state signal.

The power amplifier in a mobile handset according to one embodiment of the present invention comprises a phase shifter, coupled to input terminals of a carrier amplifier and a peak amplifier, for generating a phase difference between carrier amplifier and peak amplifier input signals to compensate for the phase shift at an output of carrier and peak amplifiers; and an output matching unit for transmitting the output powers from the carrier amplifier and the peak amplifier to an output stage. Furthermore, the peak amplifier includes a voltage control unit configured to receive the voltage control signal and bias the peak amplifier in accordance with the power levels of signals received from the base station.

In one embodiment, the phase shifter is implemented with a 3 dB hybrid coupler, for example, for distributing certain input powers to the carrier amplifier and the peak amplifier, minimizing interference between the carrier amplifier and the peak amplifier and transmitting signals in such a manner that the phase of input power applied to the peak amplifier is substantially 90° delayed from the phase of input power applied to the carrier amplifier.

In another embodiment, the phase shifter is a phase difference compensator connected in between the input stage of the power amplifier and the peak amplifier, for delaying the phase of input signal applied to the peak amplifier by 90° from the phase of input signal applied to the carrier amplifier.

The voltage control unit controls a DC bias current of the peak amplifier via the voltage control signal such that the power amplifier is operated in a Doherty mode if the power amplifier operates within the low output power range. On the other hand, if the power amplifier operates within the high output power range, the voltage control unit controls the DC bias current of the peak amplifier via the voltage control signal such that the power amplifier satisfies non-linearity characteristics.

DETAILED DESCRIPTION OF SPECIFIC EMBODIMENTS

Hereinafter, a detailed description will be given with reference to the attached drawings as to an exemplary power amplifier in a mobile handset in accordance with various embodiments of the present invention.

Figure 1:
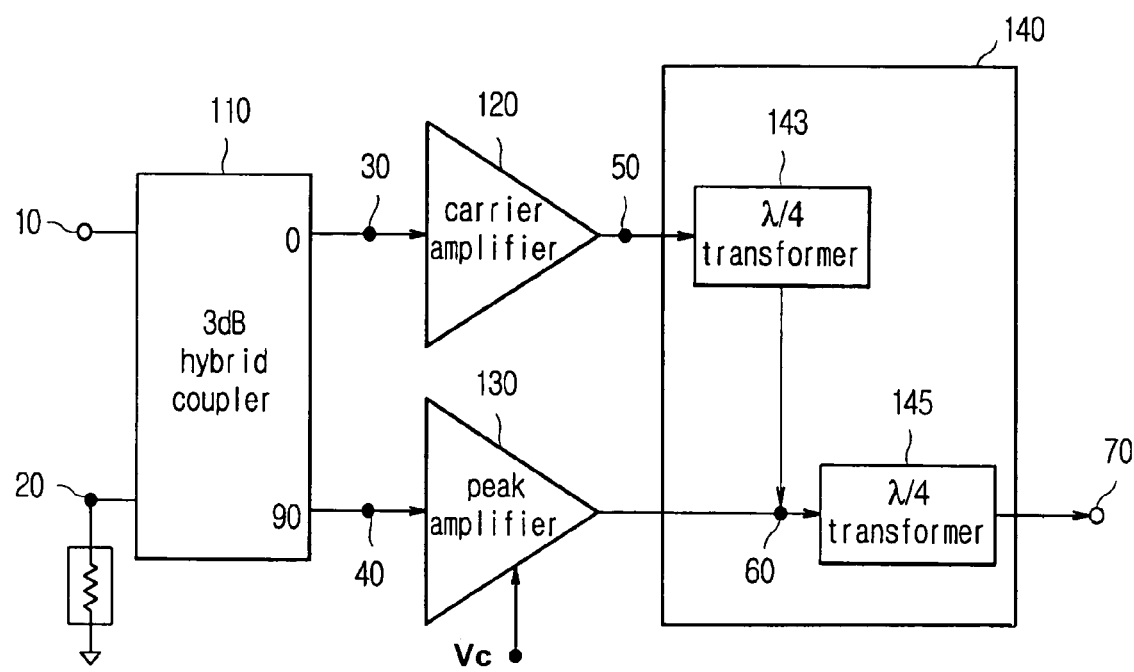
FIG. 1 is a block diagram showing the structure of a power amplifier in a mobile handset in accordance with one embodiment of the present invention.

FIG. 1 illustrates the structure of an exemplary power amplifier in a mobile handset in accordance with a specific embodiment of the present invention. The power amplifier 100 illustrated in FIG. 1 comprises a hybrid coupler, such as exemplary 3 dB hybrid coupler 110, a carrier amplifier 120, a peak amplifier 130, and an output matching unit 140. 3 dB hybrid coupler 110 distributes certain input powers to carrier amplifier 120 and peak amplifier 130, minimizes interference between carrier amplifier 120 and peak amplifier 130 and transmits signals in such a manner that the phase of input power of peak amplifier 130 is 90° ($\lambda/4$) delayed from the phase of input power of carrier amplifier 120. Accordingly, the 3 dB hybrid coupler 110 compensates for a later processing of output signals from carrier amplifier 120 and peak amplifier 130 by output matching unit 140 by generating a 90° ($\lambda/4$) phase delay at the output matching unit 140 between the phases of output signals from carrier amplifier 120 and peak amplifier 130. Thus, 3 dB hybrid coupler 110's introduction of phase difference between the phases of output powers from carrier amplifier 120 and peak amplifier 130 to compensate for subsequent processing of the output powers by the output matching unit 140 results in an equalization of the phases of the output powers and an optimum output power signal at an output stage 70. 3 dB hybrid coupler 110 is discussed further below in conjunction with FIG. 2.

Carrier amplifier 120 amplifies signals received from 3 dB hybrid coupler 110. In one example, carrier amplifier 120 includes a transistor that can be sized smaller than that of a transistor constituting peak amplifier 130. The ratio of these respective transistor sizes, in part, determines an output power range over which the maximum efficiency can be maintained. The higher this ratio, the wider the output power range over which the maximum efficiency can be maintained. One having ordinary skill in the art should appreciate that each amplifier can include one or more transistors or other like circuit elements. Further, that the ordinarily skilled artisan should recognize that carrier amplifier 120 and peak amplifier 130 can be implemented in any known semiconductor technologies, such as Si LDMOS, GaAS MESFET, GaAs pHEMT, GaAs HBT, or the like. Carrier amplifier 120 is discussed further below in conjunction with FIGS. 3A–3E.

Peak amplifier 130, which is another amplifier for amplifying signals received from 3 dB hybrid coupler 110, is not substantially operated while low-level input signals are applied to carrier amplifier 120. This is made possible by applying a voltage control signal Vc to peak amplifier 130 such that peak amplifier 130 is biased as a class B or C amplifier, where little or no DC current flows. Over the low output power range where peak amplifier 130 is not substantially operated, carrier amplifier 120 has an output impedance having a relatively constant and high value.

Since peak amplifier 130 does not draw any current, power amplifier 100 can obtain improved efficiency at an output power level which is lower than the highest output power level that carrier amplifier 120 can generate.

Peak amplifier 130 is configured to receive the voltage control signal Vc from a baseband modem chipset (not shown) or from power amplifier RF processing circuitry (not shown). The baseband modem chipset generates the voltage control signal Vc based upon power levels of signals received from a base station (not shown). The power amplifier RF processing circuitry processes signals from the baseband modem chipset, and is well know to one skilled in the art. Peak amplifier 130 is discussed further below in conjunction with FIGS. 4A–4D.

Output matching unit 140 includes a first $\lambda/4$ transformer 143. First $\lambda/4$ transformer 143 operates as an impedance inverter and is used to provide an impedance at a carrier amplifier output terminal 50 that is inverted from an impedance at a peak amplifier output terminal 60. A second $\lambda/4$ transformer 145 at the peak amplifier output terminal 60 of the peak amplifier 130 matches an output impedance of the power amplifier 100 to a reference characteristic impedance which is typically 50 ohms. Output matching unit 140 is discussed further below in conjunction with FIGS. 5–6.

Figure 2:
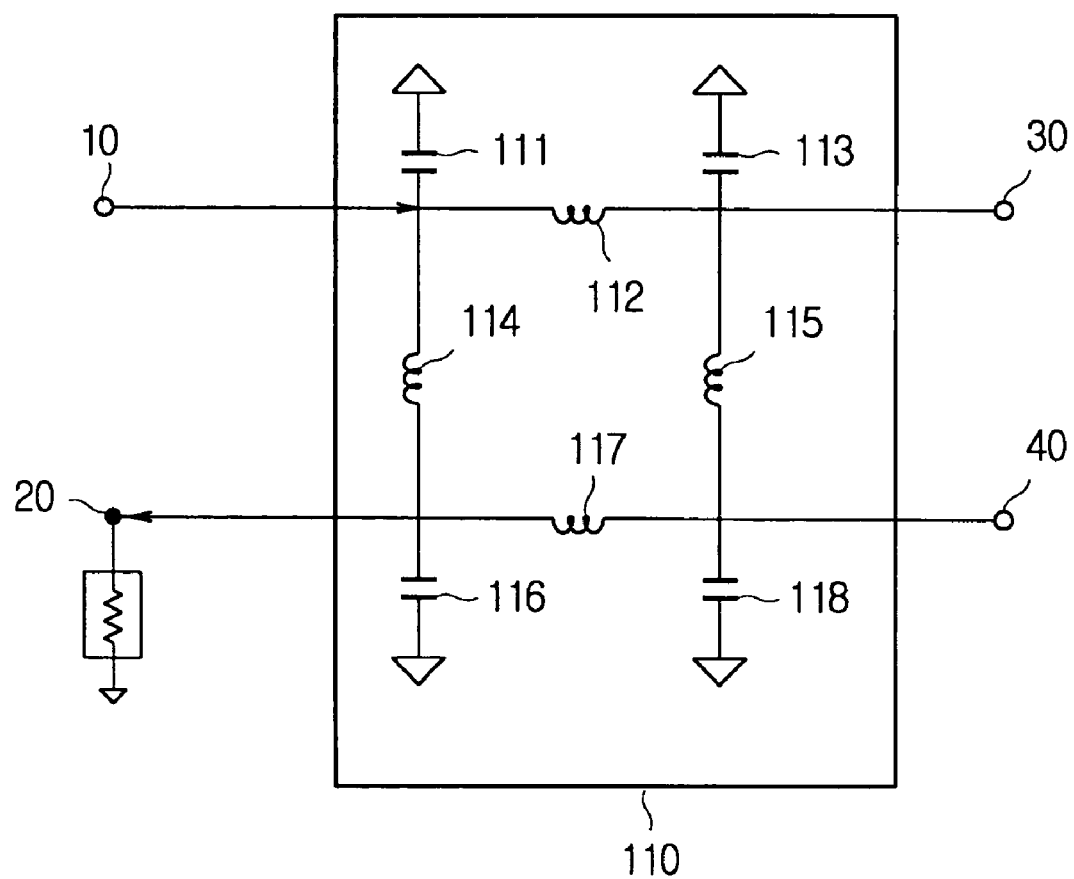
FIG. 2 shows an equivalent circuit of a 3 dB hybrid coupler that can be used in the power amplifier of FIG. 1.

FIG. 2 shows an equivalent circuit of 3 dB hybrid coupler 110 in accordance with one embodiment of the present invention. The FIG. 2 embodiment of 3 dB hybrid coupler 110 comprises a plurality of lumped elements, including a capacitor 111, an inductor 112, a capacitor 113, an inductor 114, an inductor 115, a capacitor 116, an inductor 117, and a capacitor 118. At an operating frequency of approximately 1.8 GHz, for example, nominal capacitances of capacitors 111, 113, 116, and 118 are a few pico-Farads (pF), and nominal inductances of inductors 112, 114, 115, and 117 are a few nano-Henries (nH). After signals are received by input stage 10 of 3 dB hybrid coupler 110, which has the signal coupling of about 3 dB or more, such signals are transmitted to carrier amplifier input terminal 30 (FIG. 1) and to peak amplifier input terminal 40 (FIG. 1). The signal at carrier amplifier input terminal 30 and the signal at peak amplifier input terminal 40 have a phase difference at or about 90° ($\lambda/4$, or quarter-wave).

As an example, 3 dB hybrid coupler 110 can be implemented with a transmission line, such as a coupled line coupler, a Lange coupler, a branch line coupler or other like coupling circuits known in the art. As another example, 3 dB hybrid coupler 110 may be implemented using a Microwave Monolithic Integrated Circuit (MMIC) chip technology, such as GaAS or any other known semiconductor technologies. That is, exemplary hybrid coupler 110 can be fabricated as an integrated circuit, which can be packaged as a single power amplifier device or chip. In still yet another example, 3 dB hybrid coupler 110 may be implemented by the Low Temperature Co-fired Ceramic (LTCC) method or other similar technologies.

Figure 3A:
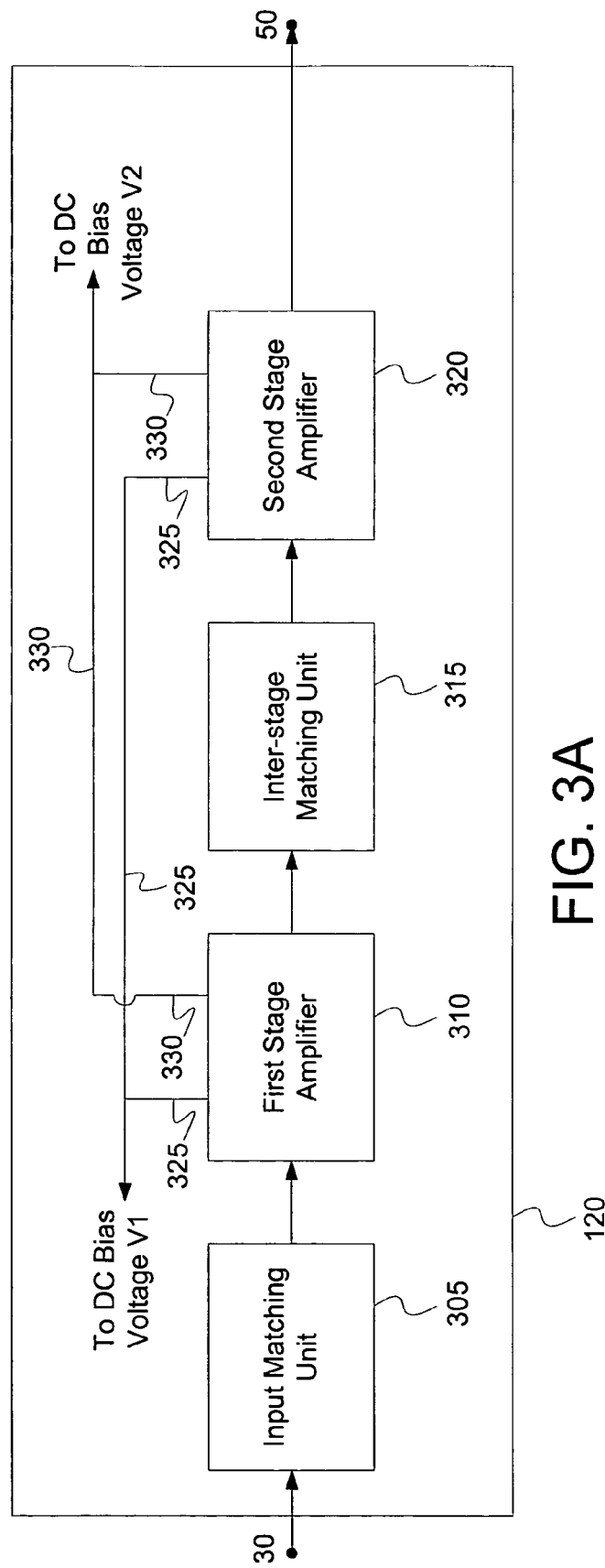
FIG. 3A is a block diagram of the carrier amplifier illustrated in FIG. 1, according to one embodiment of the invention.

FIG. 3A is a block diagram of carrier amplifier 120 illustrated in FIG. 1, according to one embodiment of the invention. In the FIG. 3A embodiment of the invention, carrier amplifier 120 is a two-stage amplifier and includes an input matching unit 305, a first stage amplifier 310, an inter-stage matching unit 315 and a second stage amplifier 320. The input matching unit 305 matches an output impedance of 3 dB hybrid coupler 110 with an input impedance of carrier amplifier 120. Similarly, the inter-stage matching unit 315 matches an output impedance of first stage amplifier 310 with an input impedance of second stage amplifier 320. Input matching unit 305 and inter-stage matching unit 315 are discussed further below in conjunction with FIGS. 3B and 3C, respectively.

In addition, carrier amplifier 120 includes conductor lines 325 electrically coupled to a DC bias voltage V1 (not shown) and conductor lines 330 electrically coupled to a DC bias voltage V2 (not shown) for biasing first stage amplifier 310 and second stage amplifier 320. In an exemplary embodiment of the invention, 2.8V<V1<3.0V and 3.2V<V2<4.2V, although the scope of the invention covers other bias voltages in accordance with operating characteristics of first stage amplifier 310 and second stage amplifier 320.

Figure 3B:
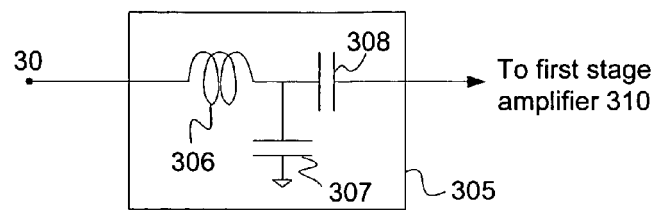
FIG. 3B is a block diagram of the input matching unit illustrated in FIG. 3A, according to one embodiment of the invention.

FIG. 3B is a block diagram of input matching unit 305 illustrated in FIG. 3A, according to one embodiment of the invention. Input matching unit 305 includes an inductor 306, a capacitor 307 and a capacitor 308. Inductor 306 electrically couples 3 dB hybrid coupler 110 (FIG. 1) with capacitor 307 and capacitor 308. Additionally, capacitor 307 is electrically coupled to ground, and capacitor 308 is electrically coupled to first stage amplifier 310 (FIG. 3A). In one embodiment of the invention, electrical characteristics of inductor 306, capacitor 307, and capacitor 308 are selected such that an output impedance of 3 dB hybrid coupler 110 is matched to an input impedance of carrier amplifier 120 (FIG. 3A), measured at a terminal 30. For example, capacitances of capacitors 307 and 308 are nominally a few pico-Farads, and inductor 306 has a nominal inductance of a few nano-Henries.

Figure 3C:
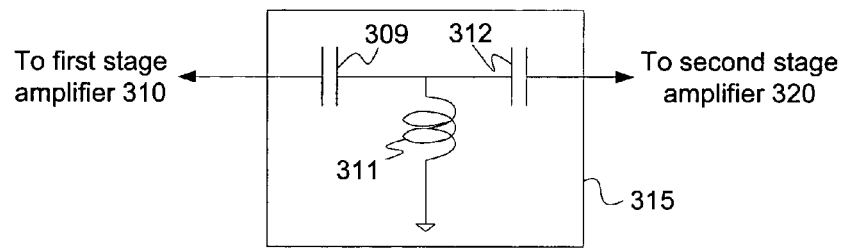
FIG. 3C is a block diagram of the inter-stage matching unit illustrated in FIG. 3A, according to the present invention.

FIG. 3C is a block diagram of inter-stage matching unit 315 illustrated in FIG. 3A, according to the present invention. Inter-stage matching unit 315 includes a capacitor 309, an inductor 311 and a capacitor 312. Capacitor 309 electrically couples a signal received from first stage amplifier 310 (FIG. 3A) with inductor 311 and capacitor 312. Furthermore, inductor 311 is electrically coupled to ground, and capacitor 312 is electrically coupled to second stage amplifier 320 (FIG. 3A). In one embodiment of the invention, electrical characteristics of capacitor 309, inductor 311, and capacitor 312 are selected such that an output impedance of first stage amplifier 310 (FIG. 3A) is matched to an input impedance of second stage amplifier 320 (FIG. 3A). For example, capacitances of capacitors 309 and 312 are nominally a few pico-Farads, and inductor 311 has a nominal inductance of a few nano-Henries.

Figure 3D:
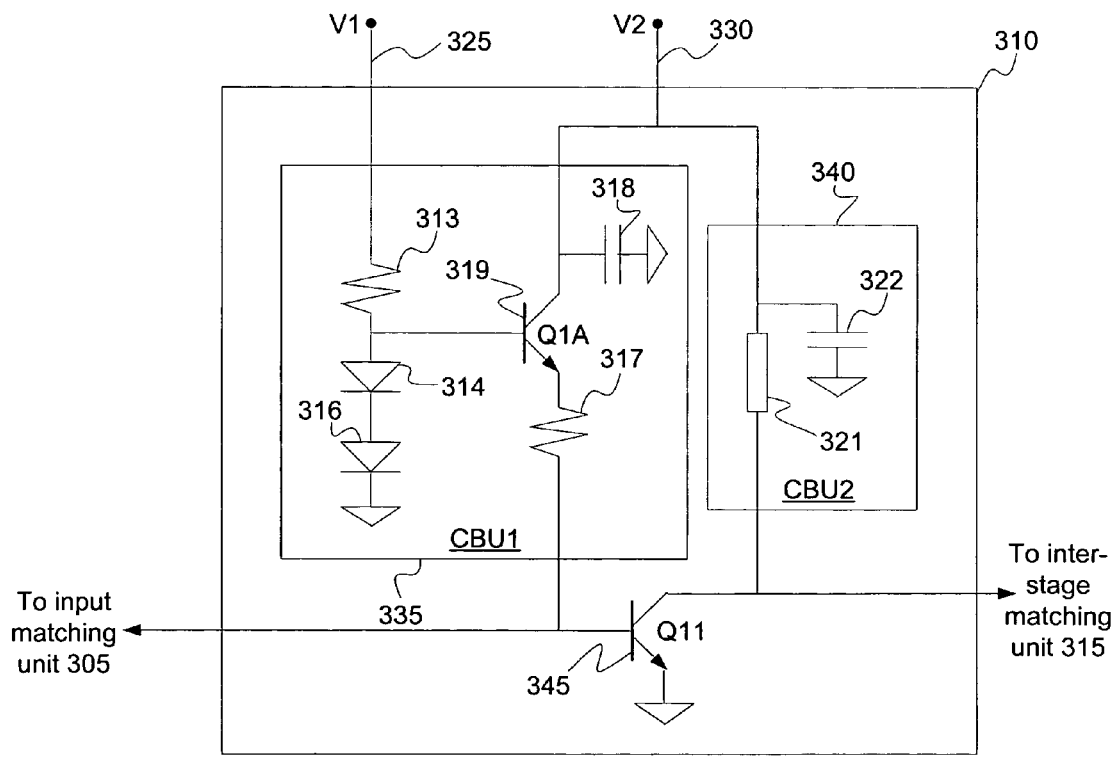
FIG. 3D is a block diagram of the first stage amplifier illustrated in FIG. 3A, in accordance with one embodiment of the invention.

FIG. 3D is a block diagram of first stage amplifier 310 illustrated in FIG. 3A, in accordance with one embodiment of the invention. First stage amplifier 310 includes a conventional bias unit 1 (CBU1) 335, a conventional bias unit 2 (CBU2) 340 and a transistor Q11 345. In the FIG. 3D exemplary embodiment of the invention, transistor Q1 345 is configured as a common-emitter npn bipolar transistor. CBU1 335 includes a resistor 313, a diode 314, a diode 316, a resistor 317, a capacitor 318, and a transistor Q1A 319. CBU2 340 includes a transmission line 321 and a capacitor 322. As known to one in the art, electrical characteristics of resistor 313, diode 314, diode 316, resistor 317, capacitor 318, and transistor Q1A 319, collectively referred to as first stage base bias elements for descriptive purposes, are selected in conjunction with DC bias voltages V1 and V2 to bias a base of transistor Q11 345 for normal mode of operation. For example, resistor 313 may have a resistance in a range of several hundred Ohms to several kilo-Ohms, resistor 317 may have a resistance in a range of several Ohms to several hundred Ohms, and a Q1A:Q11 transistor size ratio may be approximately in a range of 1:4 to 1:10. Similarly, electrical characteristics of transmission line 321 and capacitor 322, collectively referred to as first stage collector bias elements for descriptive purposes, are selected in conjunction with bias voltage V2 to bias a collector of transistor Q11 345 for normal mode of operation. For example, electrical characteristics of the first stage base bias elements are selected to specify a base-emitter current $I_{BE}$ (not shown) of transistor Q11 345 and electrical characteristics of the first stage collector bias elements are selected to specify a collector-emitter voltage $V_{CE}$ (not shown) of transistor Q11 345, thus allowing transistor Q11 345 to operate within a normal mode of operation and with a predefined amplification factor.

Figure 3E:
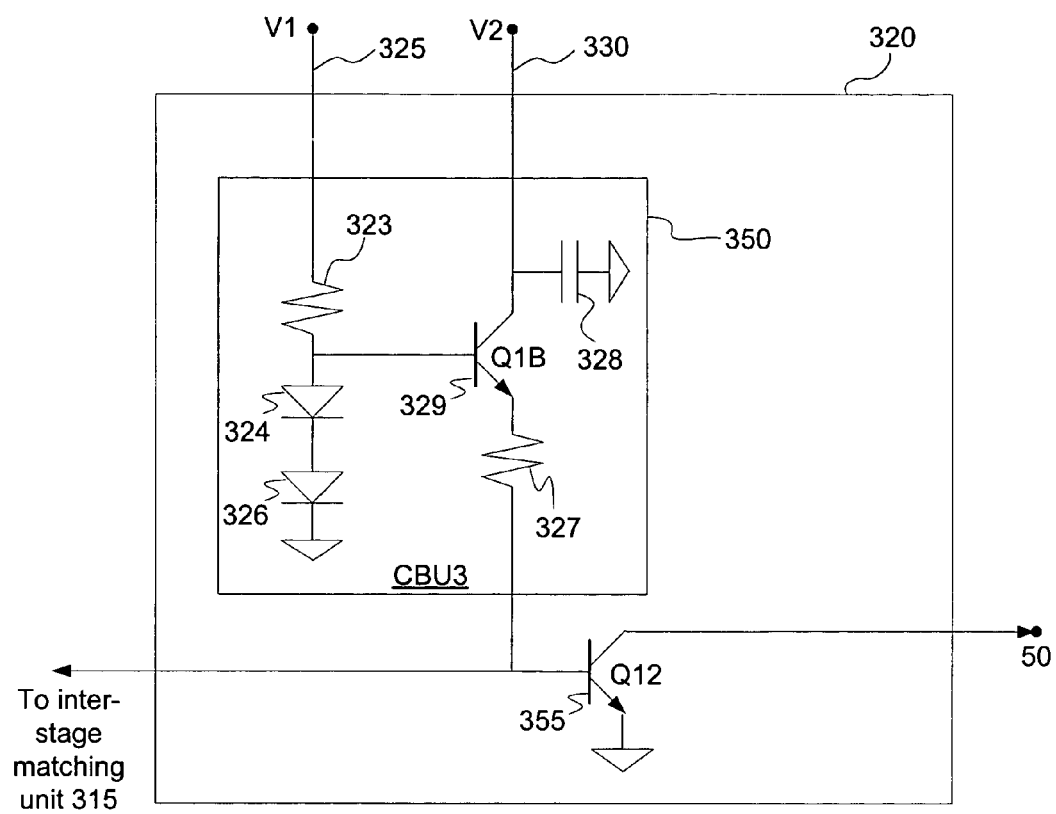
FIG. 3E is a block diagram of the second stage amplifier illustrated in FIG. 3A, according to one embodiment of the invention.

FIG. 3E is a block diagram of second stage amplifier 320 illustrated in FIG. 3A, according to one embodiment of the invention. Second stage amplifier 320 includes a conventional bias unit 3 (CBU3) 350 and a transistor Q12 355. CBU3 350 includes a resistor 323, a diode 324, a diode 326, a resistor 327, a capacitor 328, and a transistor Q1B 329, collectively referred to as second stage base bias elements. In the FIG. 3E embodiment of the invention, coupling of the second stage base bias elements of CBU3 350 is identical to coupling of the first stage base bias elements of CBU1 335 (FIG. 3D). However, electrical characteristics of the second stage base bias elements may or may not be identical to electrical characteristics of the first stage base bias elements. For example, resistor 313 (FIG. 3D) and resistor 323 may have different resistance values, and transistor Q1A 319 (FIG. 3D) and transistor Q1B 329 may be of different sizes. In operation, electrical characteristics of resistor 323, diode 324, diode 326, resistor 327, capacitor 328, and transistor Q1B 329 are selected in conjunction with DC bias voltages V1 and V2 to bias a base of transistor Q12 355 for normal-mode operation, based upon operating characteristics of transistor Q12 355 and specifications of power amplifier 100 (FIG. 1). For example, resistor 323 may have a resistance in a range of several hundred Ohms to several kilo-Ohms, resistor 327 may have a resistance in a range of several Ohms to several hundred Ohms, a Q1B:Q12 transistor size ratio may be approximately in a range of 1:4 to 1:10, and a Q11:Q12 transistor size ratio may be approximately in a range of 1:4 to 1:8. However, the scope of the present invention covers other transistor size ratios that are within operating specifications of carrier amplifier 120 (FIG. 1) and power amplifier 100 (FIG. 1). In the FIG. 3E exemplary embodiment of the invention, transistor Q12 355 is configured as a common-emitter npn bipolar transistor.

Figure 4A:
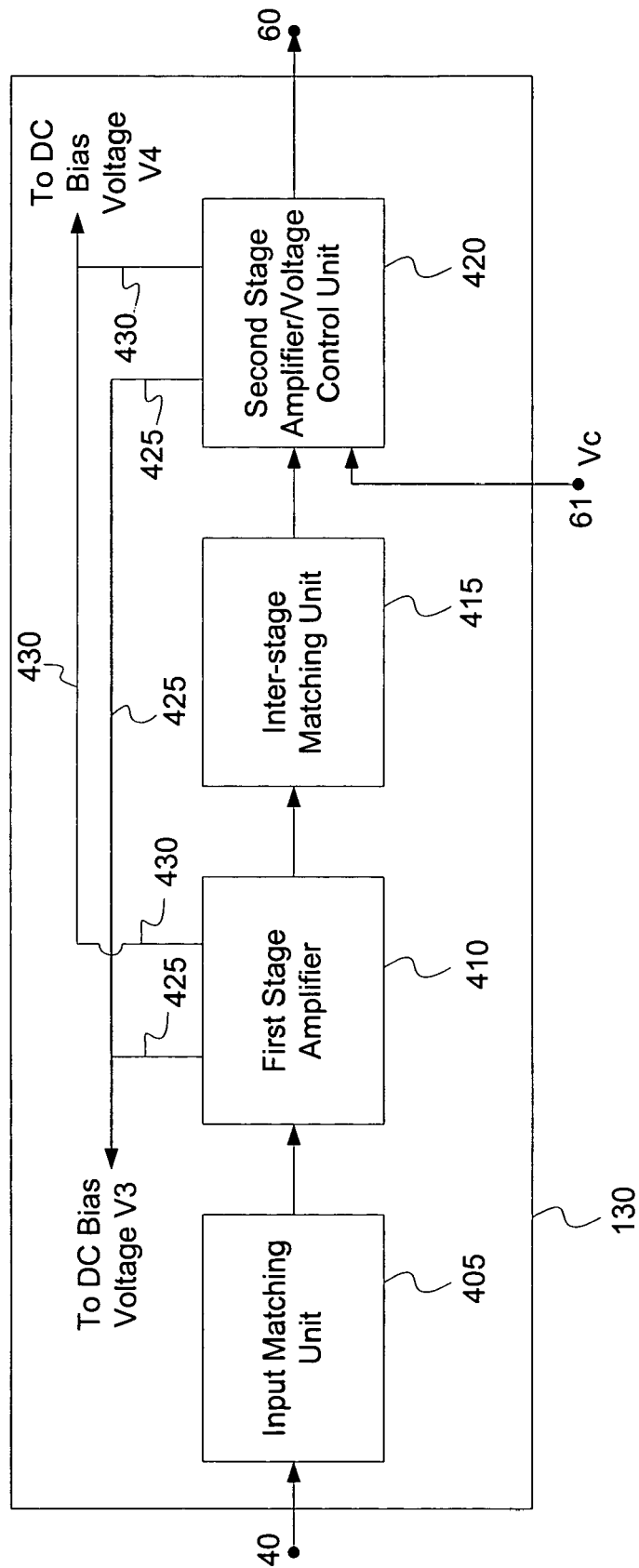
FIG. 4A is a block diagram of the peak amplifier illustrated in FIG. 1, according to one embodiment of the invention.

FIG. 4A is a block diagram of peak amplifier 130 illustrated in FIG. 1, according to one embodiment of the invention. In the FIG. 4A embodiment of the invention, peak amplifier 130 is a two-stage amplifier and includes an input matching unit 405, a first stage amplifier 410, an inter-stage matching unit 415 and a second stage amplifier/voltage control unit 420. Various embodiments of second stage amplifier/voltage control unit 420 are discussed below in conjunction with FIGS. 4B–4D.

In one embodiment of the invention, input matching unit 405 is configured as input matching unit 305 (FIG. 3B) with electrical characteristics of inductor 306 (FIG. 3B), capacitor 307 (FIG. 3B), and capacitor 308 (FIG. 3B) selected such that an output impedance of 3 dB hybrid coupler 110 (FIG. 1) is matched to an input impedance of peak amplifier 130, measured at a terminal 40. Similarly, inter-stage matching unit 415 is configured as inter-stage matching unit 315 (FIG. 3C) with electrical characteristics of capacitor 309 (FIG. 3C), inductor 311 (FIG. 3C), and capacitor 312 (FIG. 3C) selected such that an output impedance of first stage amplifier 410 is matched to an input impedance of second stage amplifier/voltage control unit 420. Finally, first stage amplifier 410 is configured as first stage amplifier 310 (FIG. 3D) with electrical characteristics of first stage base bias elements (i.e., resistor 313, diode 314, diode 316, resistor 317, capacitor 318, and transistor QIA 319), first stage collector bias elements (i.e., transmission line 321 and capacitor 322), and transistor Q11 345 (FIG. 3D) selected such that first stage amplifier 410 operates according to predefined specifications, such as gain, normal mode, and cutoff mode specifications.

Figure 4B:
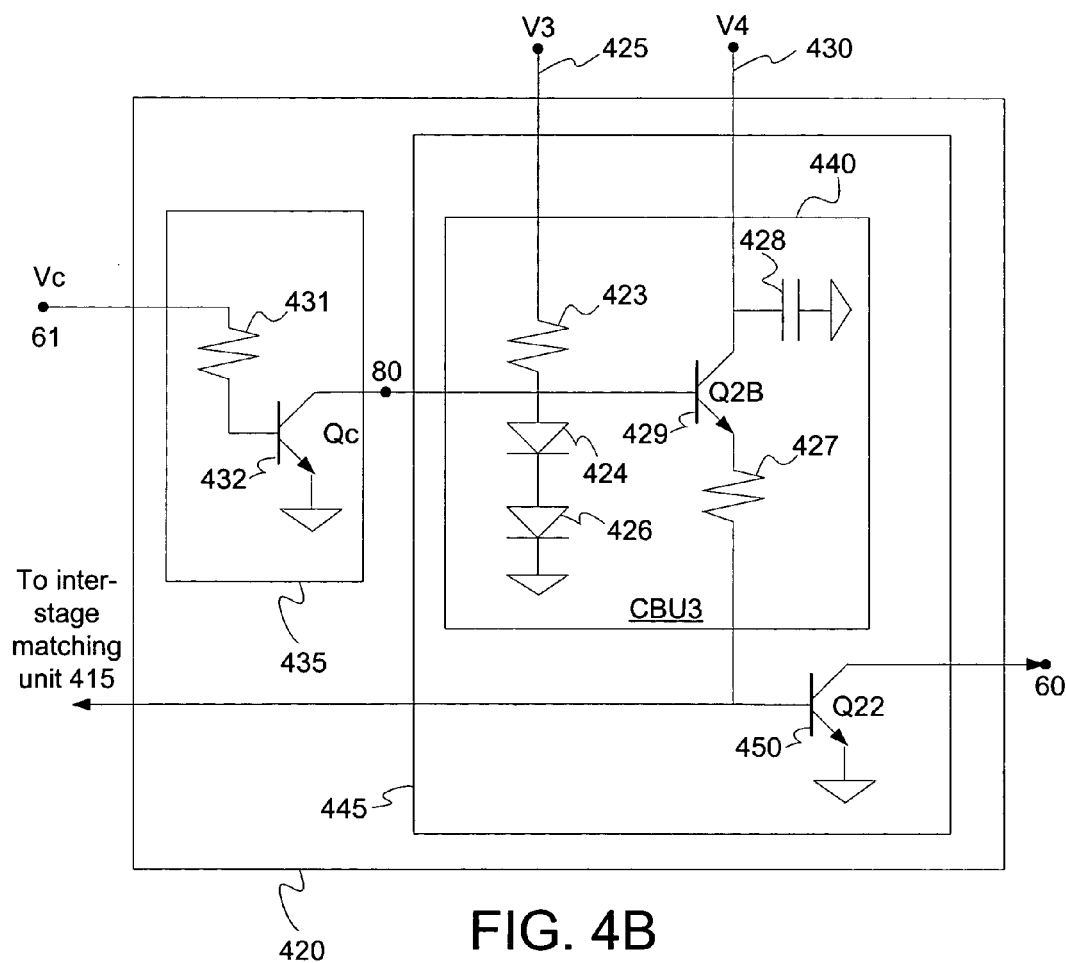
FIG. 4B is a block diagram of the second stage amplifier/voltage control unit illustrated in FIG. 4A, according to one embodiment of the invention.

FIG. 4B is a block diagram of second stage amplifier/voltage control unit 420 illustrated in FIG. 4A, according to one embodiment of the invention. The second stage amplifier/voltage control unit 420 includes a second stage amplifier 445 and a voltage control unit 435. Second stage amplifier 445 is configured as second stage amplifier 320 (FIG. 3E). For example, second stage amplifier 445 includes a CBU3 440 and a transistor Q22 450. CBU3 440 includes a resistor 423, a diode 424, a diode 426, a resistor 427, a capacitor 428, and a transistor Q2B 429, collectively referred to as second stage peak amplifier base bias elements. In operation, electrical characteristics of the second stage peak amplifier base bias elements are selected in conjunction with DC bias voltages V3 and V4 to bias a base of transistor Q22 450 for normal-mode operation, based upon operating characteristics of transistor Q22 450 and specifications of power amplifier 100 (FIG. 1). For example, resistor 423 may have a resistance in a range of several hundred Ohms to several kilo-Ohms, resistor 427 may have a resistance in a range of several Ohms to several hundred Ohms, a Q2B:Q22 transistor size ratio may be approximately in a range of 1:4 to 1:10, DC bias voltage V3 may be in a range of 2.8V to 3.0V, and DC bias voltage V4 may be in a range of 3.2V to 4.2V. Second stage amplifier 445 receives a signal from inter-stage matching unit 415, amplifies the received signal based upon the voltage control signal Vc received by voltage control unit 435, and sends the amplified signal to peak-amplifier output terminal 60.

Voltage control unit 435 receives the voltage control signal Vc (typically in a range of 2.8V to 4.2V), and controls a DC bias current of second stage amplifier 445. In the FIG. 4B embodiment of the invention, voltage control unit 435 includes a resistor 431 and a transistor Qc 432. Typically, resistor 431 has a resistance in a range of several hundred Ohms to several kilo-Ohms, and a Qc:Q2B transistor size ratio may be approximately in a range of 1:1 to 1:8. In operation, a base station (not shown) for receiving, transmitting and processing RF signals sends signals to a baseband modem chipset (not shown) in response to RF signals received from power amplifier 100. The baseband modem chipset processes the signals, and generates the voltage control signal Vc. Voltage control unit 435 then receives the voltage control signal Vc from the baseband modem chipset. In another embodiment of the invention, power amplifier 100 includes RF processing circuitry (not shown) for processing the signals received by the baseband modem chipset. In this embodiment, the RF processing circuitry generates the voltage control signal Vc, and sends the voltage control signal to the voltage control unit 435. The RF processing circuitry and the baseband modem chipset are well know in the art, and will not be described in further detail.

Typically, the baseband modem chipset generates the voltage control signal Vc based upon power levels of signals transmitted by the base station and received by the baseband modem chipset. For example, if the baseband modem chipset, upon receiving the signals from the base station, determines that power amplifier 100 operates in a low power output range, the baseband modem chipset sends a "high" voltage control signal Vc (i.e., a high voltage state signal) to voltage control unit 435. However, if the baseband modem chipset, upon receiving the signals from the base station, determines that power amplifier 100 operates in a high power output range, the baseband modem chipset sends a "low" voltage control signal Vc (i.e., low voltage state signal) to voltage control unit 435. The scope of the present invention covers a voltage control signal Vc corresponding to any voltage state and to any power output range.

In operation, if the baseband modem chipset transmits a low voltage state control signal Vc to peak amplifier 130 that indicates power amplifier 100 operates in the high power output range, the voltage control unit 435 receives the low voltage state control signal Vc and sets a DC bias current of second stage amplifier 445 of peak amplifier 130 (FIG. 4A) via the received low voltage state control signal Vc. The low voltage state control signal Vc turns off transistor Qc 432, increases base-emitter currents (not shown) of transistors Q2B 429 and Q22 450, and biases peak amplifier 130 as a class AB amplifier.

However, if the baseband modem chipset transmits a high voltage state control signal Vc to peak amplifier 130 that indicates power amplifier 100 operates in the low power output range, the voltage control unit 435 receives the high voltage state control signal Vc and sets a DC bias current of second stage amplifier 445 of peak amplifier 130 via the received high voltage state control signal Vc. The high voltage state control signal Vc turns on transistor Qc 432, and diverts base-emitter current of transistor Q2B 429 to collector-emitter current of transistor Qc 432. Thus, base-emitter currents of transistor Q2B 429 and Q22 450 decrease, and peak amplifier 130 is biased as either a class B or class C amplifier, dependent upon a resultant bias state of transistor Q22 450.

Figure 4C:
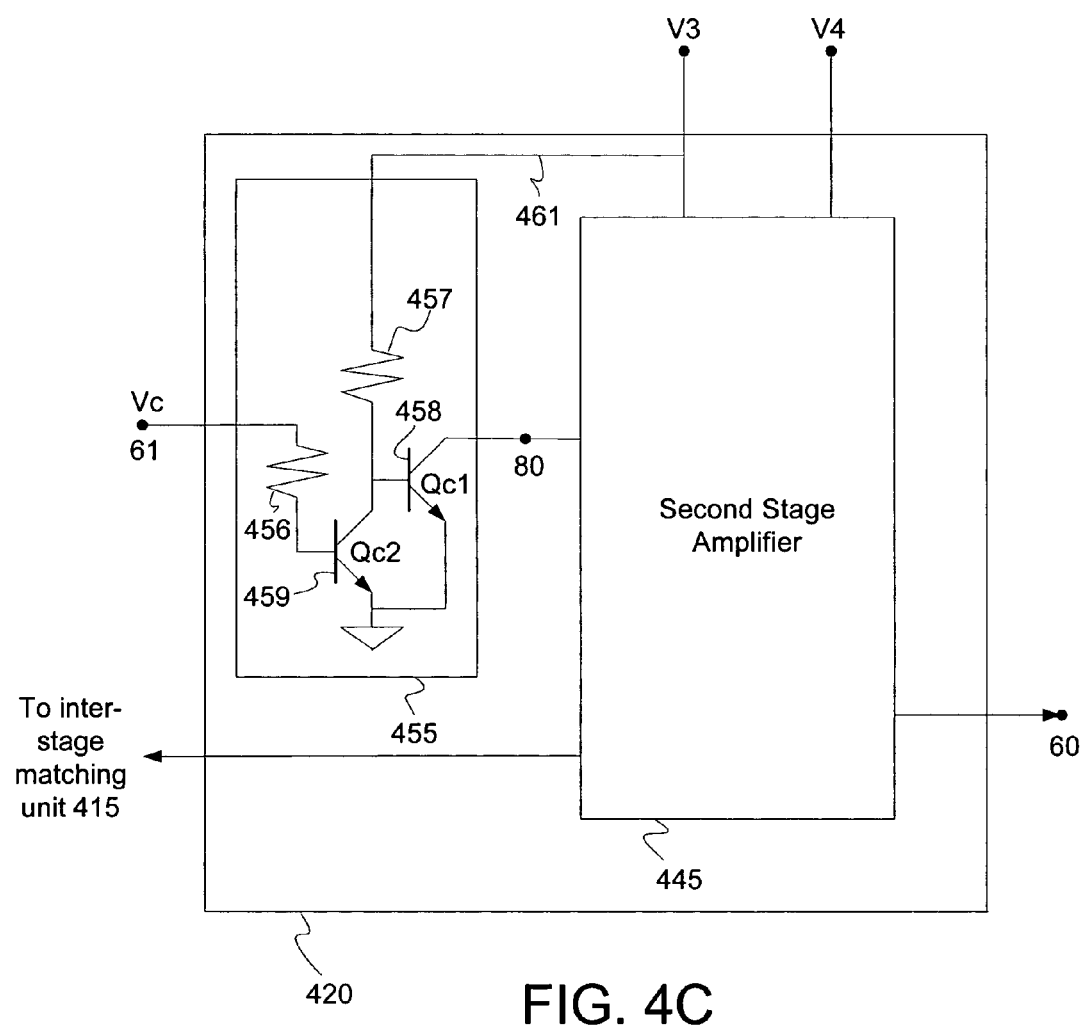
FIG. 4C is a block diagram of the second stage amplifier/voltage control unit illustrated in FIG. 4A, according to another embodiment of the invention.

FIG. 4C is a block diagram of second stage amplifier/voltage control unit 420 illustrated in FIG. 4A, according to another embodiment of the invention. Second stage amplifier/voltage control unit 420 includes second stage amplifier 445 and a voltage control unit 455. Second stage amplifier 445 is identically configured as second stage amplifier 445 illustrated in FIG. 4B. Voltage control unit 455 includes a resistor 456, a resistor 457, a transistor Qc1 458, and a transistor Qc2 459. In addition, a DC bias voltage V3 is applied to voltage control unit 455 via a line 461. Typically, resistor 456 has a resistance in a range of several hundred Ohms to several kilo-Ohms, resistor 457 has a resistance in a range of several Ohms to several hundred Ohms, a Qc2:Qc1 transistor size ratio may be approximately in a range of 1:1 to 1:10, a Qc1:Q2B (FIG. 4B) transistor size ratio may be approximately in a range of 1:1 to 1:8, DC bias voltage V3 may be in a range of 2.8V to 3.0V, a DC bias voltage V4 may be in a range of 3.2V to 4.2V, and a voltage control signal Vc may be in a range of 2.8V to 4.2V.

Input/output characteristics of voltage control unit 455 are opposite to input/output characteristics of voltage control unit 435 (FIG. 4B). That is, a low voltage state control signal Vc received at a terminal 61 biases peak amplifier 130 (FIG. 4A) as either a class B or a class C amplifier dependent upon a resultant bias state of transistor Q22 450 (FIG. 4B), and a high voltage state control signal Vc biases peak amplifier 130 as a class AB amplifier.

Figure 4D:
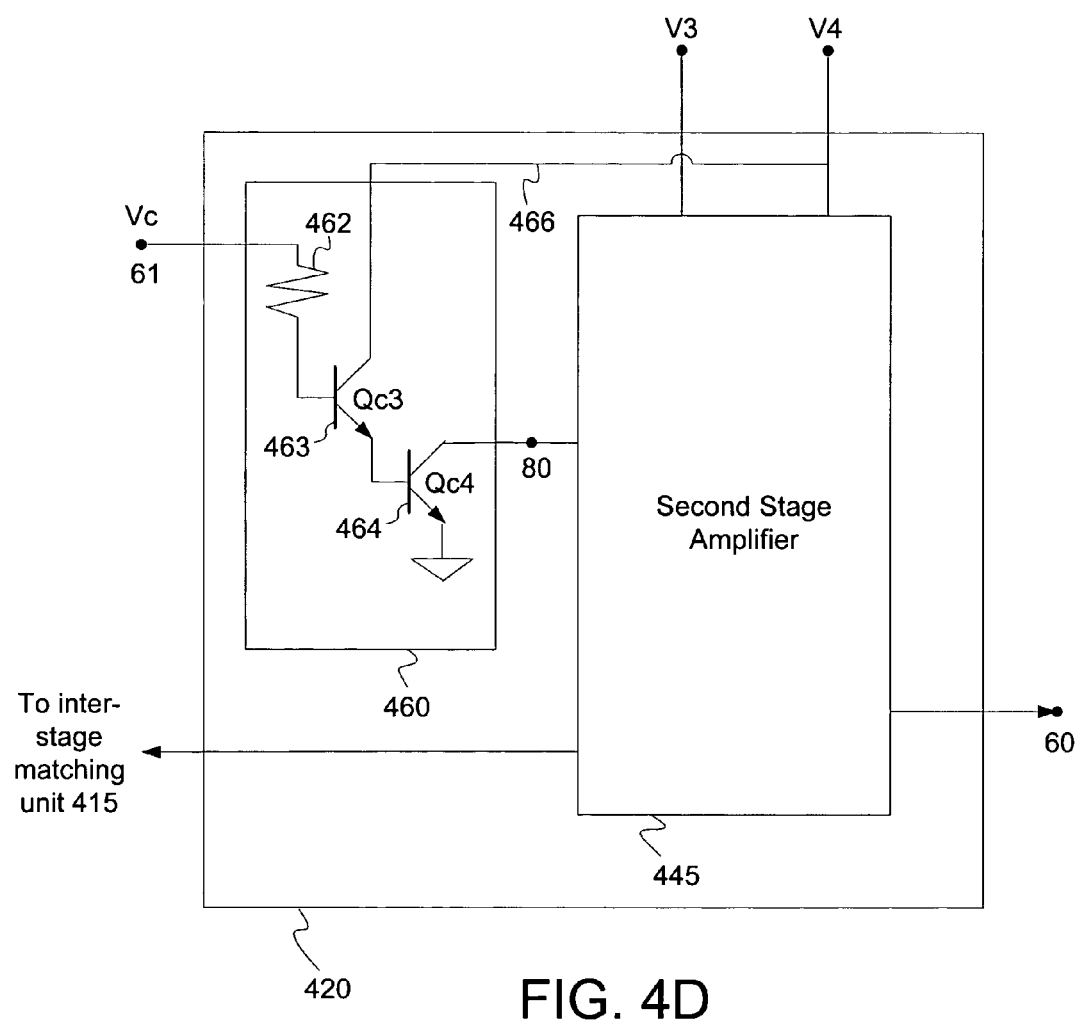
FIG. 4D is a block diagram of the second stage amplifier/voltage control unit illustrated in FIG. 4A, according to yet another embodiment of the invention.

FIG. 4D is a block diagram of second stage amplifier/voltage control unit 420 illustrated in FIG. 4A, according to yet another embodiment of the invention. Second stage amplifier/voltage control unit 420 includes second stage amplifier 445 and a voltage control unit 460. Second stage amplifier 445 is identically configured as second stage amplifier 445 illustrated in FIG. 4B. Voltage control unit 460 includes a resistor 462, a transistor Qc3 463, and a transistor Qc4 464. In addition, a DC bias voltage V4 is applied to voltage control unit 460 via a line 466. Typically, resistor 462 has a resistance in a range of several hundred Ohms to several kilo-Ohms, a Qc3:Qc4 transistor size ratio may be approximately in a range of 1:1 to 1:10, a Qc4:Q2B (FIG. 4B) transistor size ratio may be approximately in a range of 1:1 to 1:8, a DC bias voltage V3 may be in a range of 2.8V to 3.0V, DC bias voltage V4 may be in a range of 3.2V to 4.2V, and a voltage control signal Vc may be in a range of 2.8V to 4.2V.

Input/output characteristics of voltage control unit 460 are similar to input/output characteristics of voltage control unit 435 (FIG. 4B). That is, a low voltage state control signal Vc biases peak amplifier 130 as a class AB amplifier, and a high voltage state control signal Vc biases peak amplifier 130 as either a class B or a class C amplifier, dependent upon a resultant bias state of transistor Q22 450 (FIG. 4B).

Figure 5:
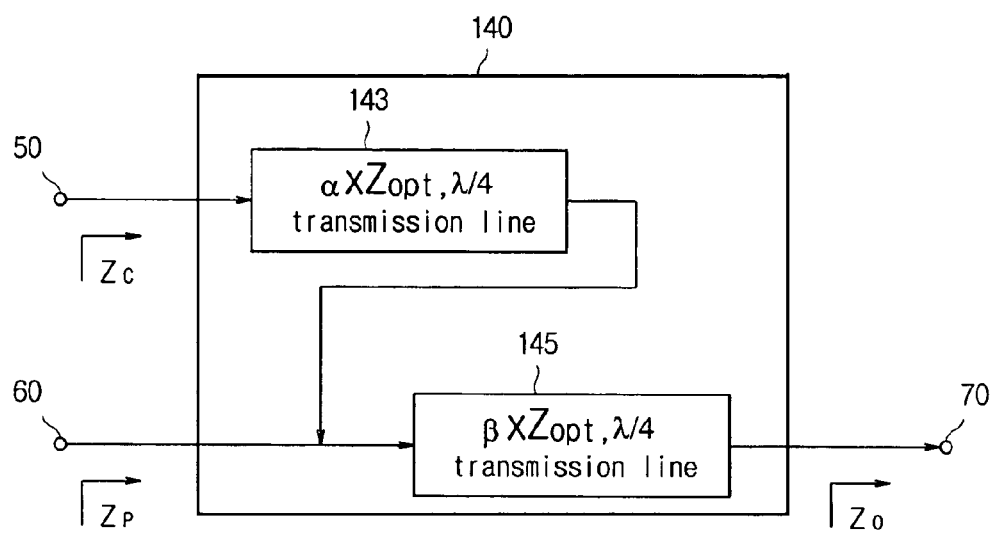
FIG. 5 is a block diagram of the exemplary output matching unit illustrated in FIG. 1.

FIG. 5 is a block diagram of output matching unit 140 illustrated in FIG. 1. By adjusting α and β (either individually or both) of first λ/4 transformer 143 and second λ/4 transformer 145, respectively, in output matching unit 140, the characteristic impedances of the two λ/4 transformer lines change. By optimizing α and β, the carrier amplifier 120 may achieve the maximum efficiency at an output power level that is lower than the highest output power level that carrier amplifier 120 may generate.

Figure 6:
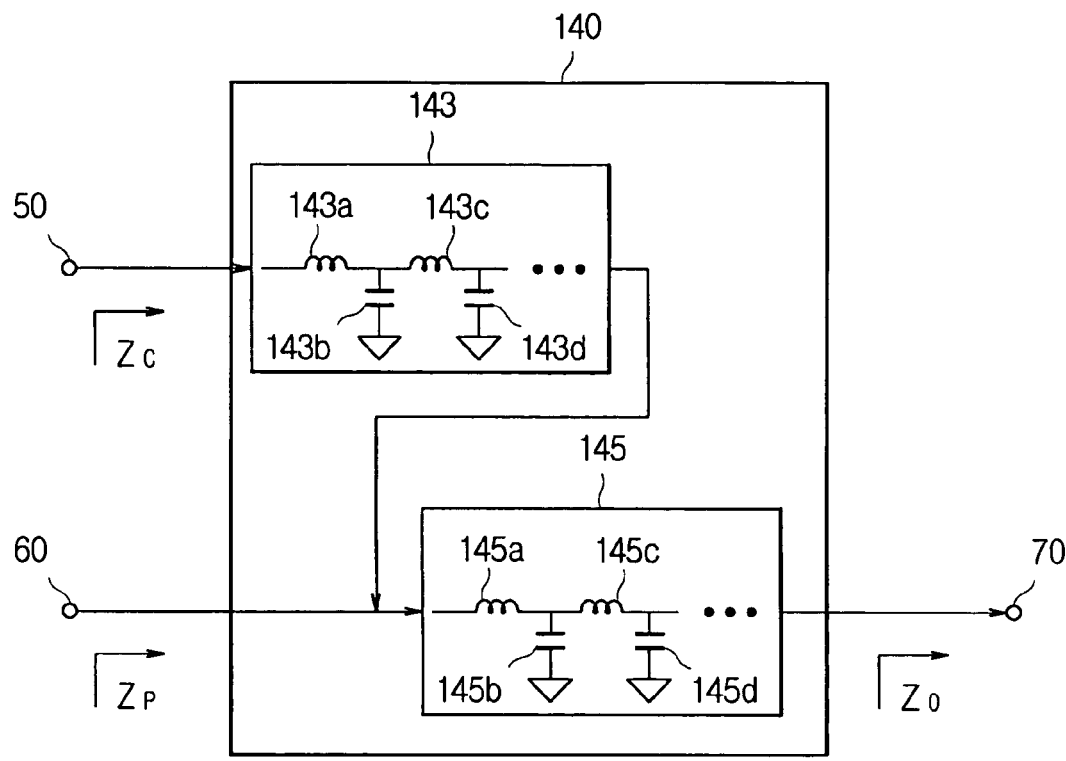
FIG. 6 shows an equivalent circuit of the exemplary output matching unit of FIG. 5, implemented with lumped elements.

First λ/4 transformer 143 and second λ/4 transformer 145 may be implemented with λ/4 transmission lines (T-lines), as shown in FIG. 5, or with lumped elements 143a, 143b, 143c, 143d, . . . , 145a, 145b, 145c, 145d, etc., as shown in FIG. 6, or with like elements. Output matching unit 140 may be implemented with many different combinations of capacitors and inductors (143a, 143b, 143c, 143d, . . . , 145a, 145b, 145c, 145d, etc.) to match a specific output impedance at output stage 70 and generate a specific impedance at carrier amplifier output terminal 50 that is inverted from an impedance at a peak amplifier output terminal 60. Alternatively, first λ/4 transformer 143 and second λ/4 transformer 145 may be implemented by either the LTCC method or a multi-layer method. As another example, first λ/4 transformer 143 and second λ/4 transformer 145 can be formed as a single integrated circuit.

Figure 7:
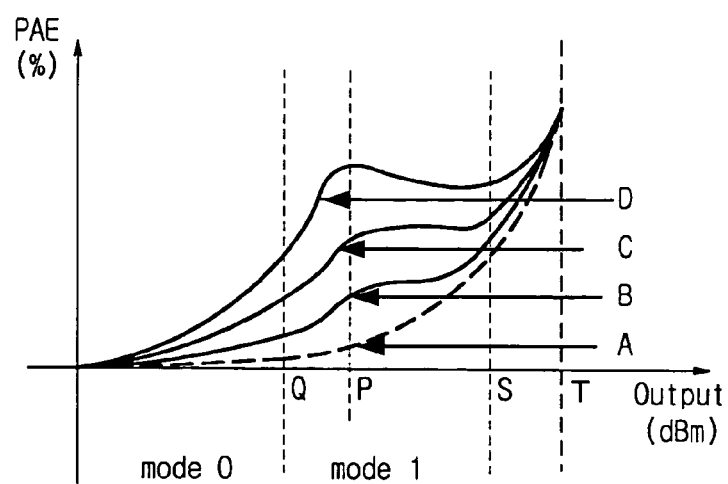
FIG. 7 is a graph illustrating efficiency characteristics dependent on a voltage control signal applied to an exemplary peak amplifier.

FIG. 7 is a graph illustrating efficiency characteristics as determined by, for example, the voltage control signal Vc applied to peak amplifier 130 (FIG. 1). Mode 0 represents the region of amplifier operation in a low output power range (i.e., from a minimum output power in dBm to point Q). Mode 1 represents the region of amplifier operation in a high output power range (i.e., from point Q to point S and/or T). As a current is increasingly applied to peak amplifier 130, an exemplary power amplifier according to an embodiment operates first as shown as curve D. Curves C and B represent the efficiency characteristics associated with the exemplary power amplifier as the amount of DC bias current increases beyond that associated with curve D. Curve A represents the efficiency characteristics of a general power amplifier.

As current starts to flow in peak amplifier 130, peak amplifier 130 commences its operation. This changes the output impedance of carrier amplifier 120, thereby optimizing efficiency of power amplifier 100 to a certain constant level as indicated by D in FIG. 7. Accordingly, as indicated by curve D in FIG. 7, the Power Added Efficiency (PAE) has the maximum value from the point P (when peak amplifier 130 starts to operate) to either point S, which is the highest allowable output power satisfying the given linearity conditions, or point T, which is the saturated output power, as generated by power amplifier 100. Thus, as illustrated, improved efficiency characteristics are achieved through an exemplary power amplifier, according to an embodiment of the present invention, in comparison with the efficiency characteristic of a general power amplifier indicated by curve A in FIG. 7. As described above, this is made possible by operating peak amplifier 130 at class B or C.

Figure 8:
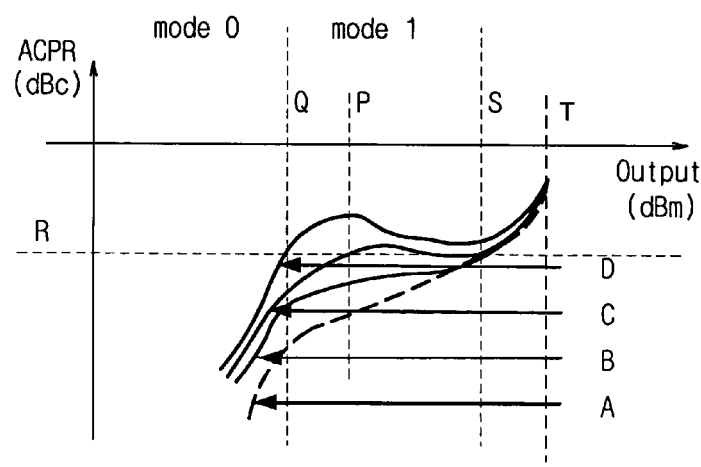
FIG. 8 is a graph illustrating non-linearity characteristics dependent on a voltage control signal applied to an exemplary peak amplifier.

However, illustrated by the graph of FIG. 8 are non-linearity characteristics as the voltage control signal Vc is applied to peak amplifier 130. In this graph, performance of power amplifier 100 is characterized with respect to the Adjacent Channel Power Ratio (ACPR) as the output power is increased. In this instance, values of the overall non-linearity characteristics (as indicated by curve D in FIG. 8) may be difficult to predict and, thus, the non-linear distortion of power amplifier 100 becomes undesirable. Accordingly, ACPR criterion R, which may be required by a specific system, may not be maintained up to the desired output power level associated with point S without violating the ACPR criteria. ACPR criteria are well known and those having ordinary skill in the art understand that R could, for example, represent −42 dBc for a CDMA cellular system or any other value.

In other words, as illustrated in FIG. 7 and FIG. 8, compared with general power amplifiers known in the related art, and if peak amplifier 130 in the power amplifier 100 is operated at class B or C (that is, if the power amplifier 100 is operated in a typical Doherty mode), then power amplifier 100 shows improved efficiency characteristics over conventional power amplifiers used, for example, in wireless communication applications. However, in terms of linearity, the power amplifier might have less predictable values when operating in the high output power range.

Therefore, an exemplary power amplifier in accordance with an embodiment of the present invention meets high efficiency and linearity requirements in the low output power range, such as at point Q, where the ACPR criterion R required by the system is satisfied. For low-power mode 0 operation, criterion R is met even if one sets the voltage control signal Vc applied to peak amplifier 130 in such a way that peak amplifier 130 is operated at class B or C where little DC current flows, and thus that power amplifier 100 is operated in the Doherty mode. On the other hand, in the high output power range during mode 1, power amplifier 100 can achieve excellent linearity by adjusting the voltage control signal Vc applied to peak amplifier 130. This linearity can be realized by increasing the DC bias current to second stage amplifier 445 of peak amplifier 130 through decrease of the voltage control signal Vc to a point where the linearity specification (or level of linearity) designated as R in FIG. 8 can be satisfied. In this way, peak amplifier 130 can be biased as a class AB amplifier depending on, for example, the mode of operation. This results in the efficiency and linearity curves of B or C in FIGS. 7 and 8.

Figure 9:
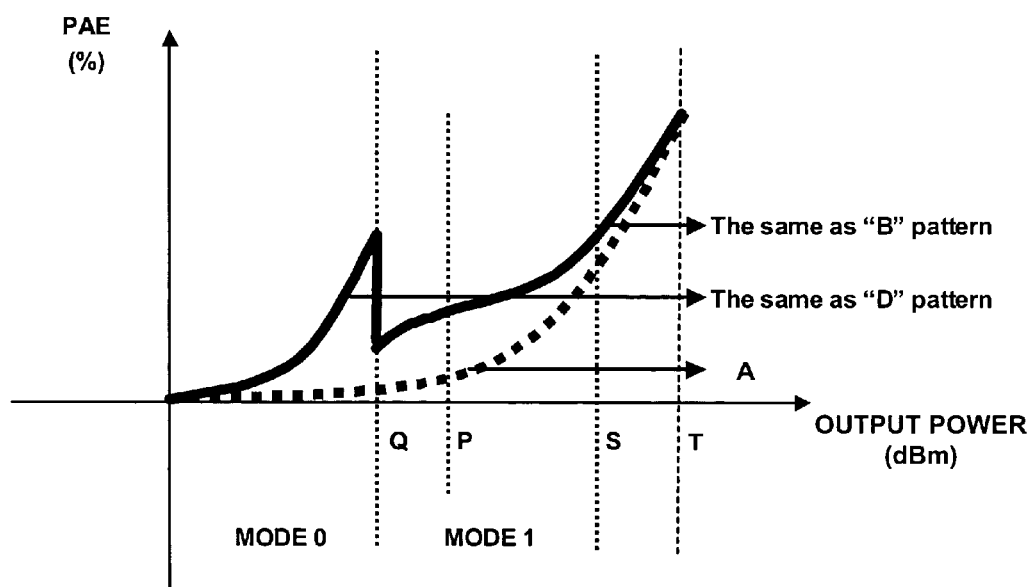
FIG. 9 is a graph illustrating efficiency characteristics corresponding to modes of the power amplifier in accordance with one embodiment of the present invention.
Figure 10:
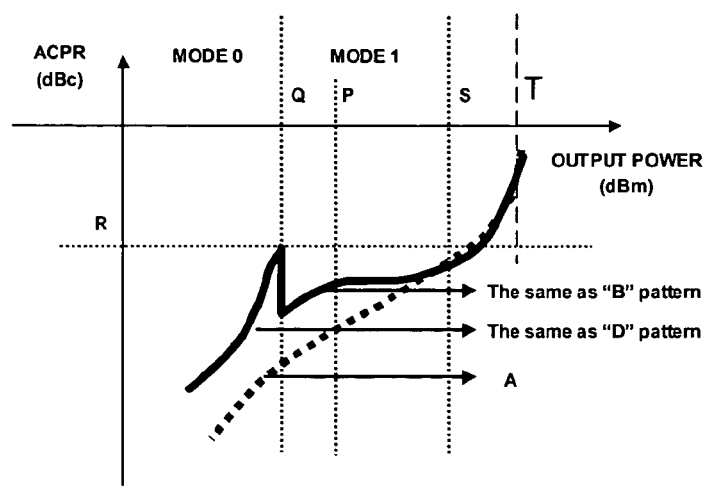
FIG. 10 is a graph illustrating non-linearity characteristics corresponding to modes of the power amplifier in accordance with a specific embodiment of the present invention.

FIG. 9 is a graph illustrating efficiency characteristics corresponding to modes of power amplifier 100 (FIG. 1) in accordance with an embodiment of the present invention. FIG. 10 is a graph illustrating non-linearity characteristics corresponding to modes of power amplifier 100 in accordance with the present invention. In operation of exemplary power amplifier 100, consider FIG. 10. When the power amplifier 100 requires an output power level reaching point Q, where mode switching is needed, the baseband modem chipset (not shown) sends a low voltage state control signal Vc to peak amplifier 130 so that an increased bias current may be applied to peak amplifier 130. In this way, linearity of power amplifier 100 in accordance with an embodiment of the present invention is enhanced with a slight reduction in the efficiency. In one embodiment of the invention, point Q is in a range of 15–19 dBm, however, the present invention covers other operating output powers at which power amplifier 100 switches modes. The efficiency and linearity curves in mode 1 is similar to those of curves B (FIGS. 7–8). This prevents criteria R from being violated.

Figure 11:
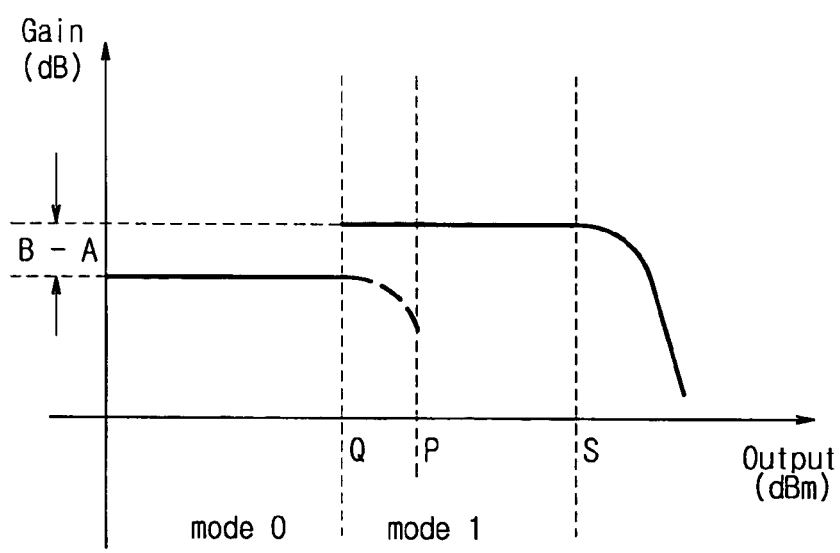
FIG. 11 is a graph illustrating gain characteristics corresponding to modes of the power amplifier in accordance with the present invention.

FIG. 11 is a graph illustrating gain characteristics corresponding to modes of power amplifier 100 (FIG. 1) in accordance with the present invention. In the present invention, carrier amplifier 120 and peak amplifier 130 may be operated to have the same linear gain characteristics. However, the overall system is not affected even if carrier amplifier 120 and peak amplifier 130 are implemented to be operated with different linear gain characteristics since two modes can be distinguished clearly and be operated independently in accordance with a specific embodiment of the present invention.

Figure 12:
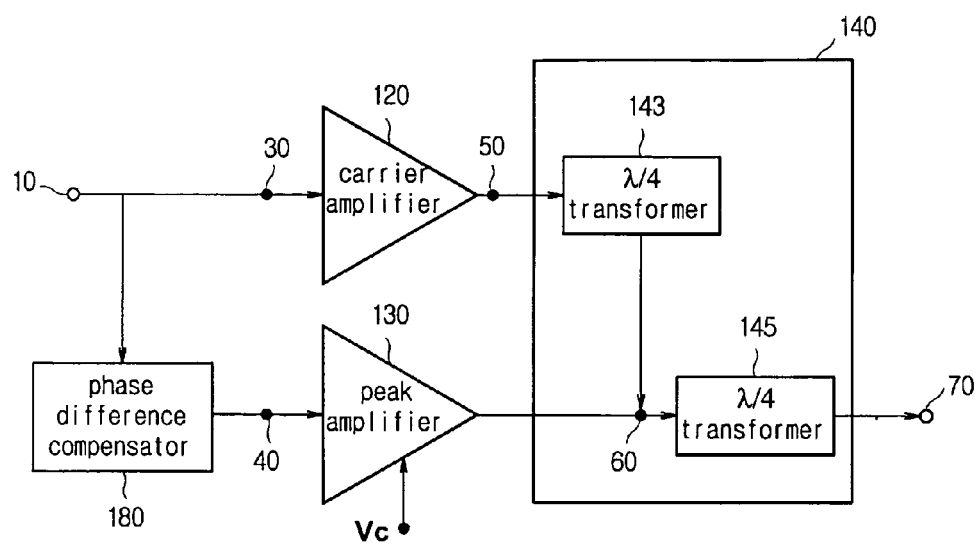
FIG. 12 is a block diagram showing the structure of a power amplifier in accordance with another embodiment of the present invention.

FIG. 12 is a block diagram showing the structure of a power amplifier in a mobile handset in accordance with another embodiment of the present invention. The power amplifier according to another embodiment of the present invention is substantially the same as the power amplifier 100 shown in FIG. 1, in terms of the structure and operation. Therefore, the same reference numerals refer to the same parts in the power amplifiers according to FIG. 1 and FIG. 12. Thus, a detailed description of the power amplifier according in FIG. 12 is not necessary for one having ordinary skill in the art and thus is omitted.

As shown in FIG. 12, another exemplary power amplifier in accordance with another embodiment comprises a phase difference compensator 180 which replaces 3 dB hybrid coupler 110 of FIG. 1. Phase difference compensator 180 is coupled to input stage 10 and peak amplifier 130 so that the input signal is applied to peak amplifier 130 and to carrier amplifier 120, where phase difference compensator 180 has a phase difference of 90° (λ/4).

As described above, because input signal applied to peak amplifier 130 and input signal applied to carrier amplifier 120 has a phase difference of 90° (λ/4) through the operation of the phase difference compensator 180, when the output powers from the carrier amplifier 120 and the peak amplifier 130 join in the output matching unit 140, there would be no phase difference and thus the optimum output power may be obtained.

If phase difference compensator 180 is used instead of 3 dB hybrid coupler 110, the phase difference compensator 180 may be implemented with one simple transmission line. Alternatively, the phase difference compensator 180 may be implemented with lumped elements because the simple transmission line may be approximated to inductance values. In this manner, the power amplifier may be implemented without a complex 3 dB hybrid coupler 110 or a large-size transmission line outside of the amplifier. Furthermore, because the phase difference compensator 180 may be integrated within a single chip and/or a single integrated circuit, the overall size of power amplifier 100 may be reduced and the price of power amplifier 100 may also be reduced.

In summary, when a low output power range (mode 0) generated by power amplifier 100 of the mobile handset is adequate for proper functioning of a mobile handset/base station pair, as determined by power levels of signals received by the baseband modem chipset, then the baseband modem chipset sends a voltage control signal Vc in a first state to peak amplifier 130 such that power amplifier 100 is operated in the Doherty mode (i.e., so that peak amplifier 130 is operated as a class B or C amplifier). In contrast, if a low output power range (mode 0) generated by power amplifier 100 of the mobile handset is inadequate for proper functioning of a mobile handset/base station pair as determined by the power levels of signals received by the baseband modem chipset, and the base station requires power amplifier 100 to operate in the high output power range (mode 1), then the baseband modem chipset sends a voltage control signal Vc in a second state to peak amplifier 130 such that DC bias current applied to peak amplifier 130 is increased and the ACPR is improved up to point R where the non-linearity specification of power amplifier 100 is satisfied. In one embodiment of the invention, the voltage control signal Vc in the first state is a high voltage state signal, and the voltage control signal Vc in the second state is a low voltage state signal. In another embodiment of the invention, the voltage control signal Vc in the first state is the low voltage state signal, and the voltage control signal Vc in the second state is the high voltage state signal.

Although several embodiments of the present invention have been disclosed for illustrative purposes, those skilled in the art will appreciate that various modifications, additions and substitutions are possible, without departing from the scope and spirit of the invention as disclosed in the accompanying claims.

As described above, an exemplary power amplifier of the present invention in a mobile handset that provides improves efficiency and linearity, by controlling a DC bias current applied to a peak amplifier of the mobile handset via a control signal Vc received from a baseband modem chipset according to relevant power levels of signals received by the baseband modem chipset has been shown. For example, in the low output power range, a state of a control signal Vc applied to a peak amplifier is selected so that the power amplifier of the present invention is operated in the Doherty mode and, in the high output power range, the state of the control signal Vc applied to the peak amplifier is selected so as to satisfy the non-linearity specification of the power amplifier.

Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. The scope of the invention is not limited to the described embodiments and is to be determined solely by the appended claims.

What is claimed is:

1. A system for bias control of a power amplifier, comprising:
 a carrier amplifier coupled to an input stage for amplifying an input signal;
 a peak amplifier coupled to the input stage for amplifying the input signal, the peak amplifier configured to receive a voltage control signal for biasing the peak amplifier, the voltage control signal based on power levels of signals transmitted by a remote base station, and
 an output matching unit configured to receive an output signal from the peak amplifier and an output signal from the carrier amplifier to generate a substantially optimum power amplifier output power signal at an output stage, the output matching unit including
  a first quarter wavelength transformer coupled to a carrier amplifier output terminal; and
  a second quarter wavelength transformer coupled to a peak amplifier output terminal, an output of the first quarter wavelength transformer, and the output stage.

2. The system of claim 1, wherein the carrier amplifier further comprises a carrier first stage amplifier coupled to the input stage; and
 a carrier second stage amplifier coupled to the carrier first stage amplifier and a carrier amplifier output terminal.

3. A system, for bias control of a power amplifier, comprising:
 a carrier amplifier coupled to an input stage for amplifying an input signal; and
 a peak amplifier coupled to the input stage for amplifying the input signal, the peak amplifier configured to receive a voltage control signal for biasing the peak amplifier, the peak amplifier including
  a peak first stage amplifier coupled to the input stage;
  a peak second stage amplifier coupled to the peak first stage amplifier and a peak amplifier output terminal; and
  a voltage control unit coupled to the peak second stage amplifier, the voltage control unit configured to bias the peak amplifier via the received voltage control signal.

4. The system of claim 3, wherein the voltage control unit biases the peak amplifier as a class B or a class C amplifier based upon a state of the received voltage control signal.

5. The system of claim 3, wherein the voltage control unit biases the peak amplifier as a class AB amplifier based upon a state of the received voltage control signal.

6. The system of claim 1, wherein the power amplifier is configured to generate the voltage control signal in a first state if the power levels of the signals transmitted by the remote base station indicate that the power amplifier operates in a low output power range.

7. The system of claim 1, wherein the power amplifier is configured to generate the voltage control signal in a second state if the power levels of the signals transmitted by the remote base station indicate that the power amplifier operates in a high output power range.

8. The system of claim 1, further comprising a 3dB hybrid coupler configured to receive the input signal from the input stage, send a first input signal to an input of the carrier amplifier, and send a second input signal to an input of the peak amplifier, the second input signal shifted in phase by approximately ninety degrees from the first input signal.

9. The system of claim 8, further comprising an output matching unit configured to receive an output signal from the peak amplifier and an output signal from the carrier amplifier to generate a substantially optimum power amplifier output power signal at an output stage.

10. A system for bias control of a power amplifier, comprising:
 a carrier amplifier coupled to an input stage for amplifying an input signal;
 a peak amplifier coupled to the input stage for amplifying the input signal, the peak amplifier configured to receive a voltage control signal for biasing the peak amplifier;
 a 3dB hybrid coupler configured to receive the input signal from the input stage, send a first input signal to an input of the carrier amplifier, and send a second input signal to an input of the peak amplifier, the second input signal shifted in phase by approximately ninety degrees from the first input signal; and
 an output matching unit configured to receive an output signal from the peak amplifier and an output signal from the carrier amplifier to generate a substantially optimum power amplifier output power signal at an output stage, the output matching unit including a first quarter wavelength transformer coupled to a carrier amplifier output terminal; and a second quarter wavelength transformer coupled to a peak amplifier output terminal, an output of the first quarter wavelength transformer, and the output stage.

11. A system for controlling a power amplifier in a mobile handset, comprising:

a carrier amplifier having a carrier input terminal and a carrier output terminal;

a peak amplifier having a peak input terminal, a peak output terminal and a control terminal for receiving a voltage control signal, the peak amplifier configured to vary at least one characteristic of the power amplifier based upon the voltage control signal;

a phase shifter, coupled to the carrier input terminal and the peak input terminal, for generating a peak amplifier input signal delayed in phase from a carrier amplifier input signal; and an output matching unit, coupled to the carrier output terminal and the peak output terminal, for transmitting a carrier output power signal and a peak output power signal and forming a power amplifier output power signal at a power amplifier output stage, the output matching unit including a first transformer having an input coupled to the carrier output terminal and an output coupled to the peak output terminal; and a second transformer having an input coupled to the output of the first transformer and an output coupled to the power amplifier output stage.

12. The system of claim 11, further comprising a baseband modem chipset for receiving signals transmitted by a remote base station and generating the voltage control signal in a first voltage state if power levels of the received signals indicate that the power amplifier operates within a low power range and generating the voltage control signal in a second voltage state if the power levels of the received signals indicate that the power amplifier operates within a high power range.

13. The system of claim 11, wherein the phase shifter is a hybrid coupler for distributing certain input powers to the carrier amplifier and the peak amplifier.

14. The system of claim 13, wherein the hybrid coupler is a 3dB hybrid coupler implemented with lumped elements.

15. The system of claim 13, wherein the hybrid coupler is implemented by the Low Temperature Co-fired Ceramic (LTCC) method.

16. The system of claim 11, wherein the phase shifter is a phase difference compensator.

17. The system of claim 16, wherein the phase difference compensator is implemented with a transmission line.

18. The system of claim 16, wherein the phase difference compensator is implemented with lumped elements.

19. The system of claim 11, wherein the output matching unit is implemented with lumped elements.

20. The system of claim 11, wherein the output matching unit is implemented by a Low Temperature Co-fired Ceramic (LTCC) method.

21. The system of claim 11, wherein the at least one characteristic of the power amplifier is linearity.

22. The system of claim 12, wherein the peak amplifier further comprises a voltage control unit configured to receive the voltage control signal and control a bias current of the peak amplifier such that the power amplifier is operated as a Doherty-type amplifier when the voltage control signal is in the first voltage state and the peak amplifier is operated as a class AB amplifier when the voltage control signal is in the second voltage state.

23. The system of claim 11, wherein the and the second transformer are both quarter wavelength transformers.

24. A method of operating a power amplifier in a wireless transmitting device in at least two modes, the power amplifier including a carrier amplifier and a peak amplifier, the method comprising:

generating a voltage control signal in a first voltage state if power levels of signals transmitted by a remote base station and received by the power amplifier indicate that the power amplifier operates within a low power range;

generating a voltage control signal in a second voltage state if the power levels of signals transmitted by the remote base station and received by the power amplifier indicate that the power amplifier operates within a high power range;

biasing the peak amplifier via the voltage control signal, and biasing a carrier amplifier independently from the voltage control signal.

25. The method of claim 24, wherein biasing further comprises the step of biasing the peak amplifier via the voltage control signal in the first voltage state to operate the power amplifier as a Doherty-type amplifier.

26. The method of claim 24, wherein biasing further comprises the step of biasing the peak amplifier via the voltage control signal in the second voltage state to improve a non-linearity characteristic of the power amplifier.

27. The method of claim 24, wherein biasing further comprises the step of biasing the peak amplifier via the voltage control signal in the second voltage state to operate the peak amplifier as a class AB amplifier.

28. A system of operating a power amplifier in a wireless transmitting device in at least two modes, the power amplifier including a carrier amplifier and a peak amplifier, the method comprising:

means for generating a voltage control signal in a first voltage state if power levels of signals transmitted by a remote base station and received by the power amplifier indicate that the power amplifier operates within a low power range;

means for generating a voltage control signal in a second voltage state if the power levels of signals transmitted by the remote base station and received by the power amplifier indicate that the power amplifier operates within a high power range;

means for biasing the peak amplifier via the voltage control signal, and means for biasing the carrier amplifier independently from the voltage control signal.

29. The system of claim 28, wherein means for biasing further comprises means for biasing the peak amplifier to operate the power amplifier as a Doherty-type amplifier if the voltage control signal is in the first voltage state.

30. The method of claim 28, wherein means for biasing further comprises means for biasing the peak amplifier to improve a non-linearity characteristic of the power amplifier if the voltage control signal is in the second voltage state.

31. The system of claim 1, wherein the carrier amplifier is biased independently from the peak amplifier.

* * * * *